(12) United States Patent
Kim

(10) Patent No.: US 6,341,549 B2
(45) Date of Patent: *Jan. 29, 2002

(54) TRIMMING APPARATUS HAVING PUNCHES WITH AIR FLOW ROUTES FOR REMOVAL OF GATE SCRAPS

(75) Inventor: Sang Ki Kim, Cheonan (KR)

(73) Assignee: Samsung Electronic Co., Ltd., Kyoungki-do (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/187,324

(22) Filed: Nov. 6, 1998

(30) Foreign Application Priority Data

Dec. 30, 1997 (KR) ............................................. 97-78863

(51) Int. Cl.[7] ................................................. B26D 7/18
(52) U.S. Cl. ............................... 83/942; 83/98; 83/100; 29/827
(58) Field of Search ............................ 83/942, 98, 99, 83/100; 29/827

(56) References Cited

U.S. PATENT DOCUMENTS

| 3,452,626 A | * | 7/1969 | Speakman | 83/98 |
|---|---|---|---|---|
| 3,524,368 A | * | 8/1970 | Goldman | 83/98 |
| 3,580,120 A | * | 5/1971 | Adams | 83/98 |
| 3,799,017 A | * | 3/1974 | Halligan | 83/167 |
| 4,425,829 A | * | 1/1984 | Kranik et al. | 83/62.1 |
| 4,989,482 A | * | 2/1991 | Mason | 83/98 |
| 5,046,389 A | * | 9/1991 | Thompson et al. | 83/942 |
| 5,111,723 A | * | 5/1992 | Andrusch et al. | 83/98 |
| 5,271,146 A | * | 12/1993 | Kashiwagi | 83/942 |
| 5,291,814 A | * | 3/1994 | Fierkens | 83/685 |
| 5,296,082 A | * | 3/1994 | Kubo | 156/500 |
| 5,495,780 A | * | 3/1996 | Ong | 76/101.1 |
| 5,907,985 A | * | 6/1999 | Bezama et al. | 83/24 |
| 5,996,458 A | * | 12/1999 | Maeda | 83/456 |
| 6,003,418 A | * | 12/1999 | Bezama et al. | 83/98 |
| 6,065,381 A | * | 5/2000 | Kim et al. | 83/98 |

* cited by examiner

Primary Examiner—M. Rachuba
Assistant Examiner—Kim Ngoc Tran
(74) Attorney, Agent, or Firm—Skjerven Morrill MacPherson LLP; David W. Heid

(57) ABSTRACT

A trimming apparatus according to the present invention has a trim punch that provides a route for continuous air flow to prevent trimmed gate scraps from clogging the apparatus. The trim punch can have a groove or a through hole for providing the continuous air flow from outside into an outlet, through which trimmed gate scraps are discharged. This continuous air flow prevents the trimmed gate scraps from remaining inside the outlet and adhering to the trim punch. Therefore, clogging of the trimmed gate scraps in the apparatus is prevented.

13 Claims, 6 Drawing Sheets

TRIMMING APPARATUS HAVING PUNCHES WITH AIR FLOW ROUTES FOR REMOVAL OF GATE SCRAPS

BACKGROUND OF THE INVENTION

1. Field of the Invention

The present invention generally relates to an apparatus for manufacturing semiconductor device packages, and more particularly to an apparatus having trim punches with an air inflow route for trimming gate scrap from a lead frame on which encapsulated package bodies are formed.

2. Description of the Related Arts

In a manufacturing process of semiconductor device packages, a semiconductor chip is attached and electrically connected to a lead frame and sealed in an encapsulant such as an EMC (Epoxy Molding Compound). Encapsulation protects the chip from external environmental stresses and improves the reliability of the chip's electrical operation. During an encapsulation process, the lead frame having multiple semiconductor chips mounted thereon is engaged between upper and lower molds which form cavities in the shape of package bodies, and the encapsulant is injected through gates into the cavities to fill the cavities. The encapsulant is cured, and the lead frame with attached package bodies is separated from the molds. After removal from the molds, scraps of the encapsulant still remain on the package bodies at gates which provide an injection route for the encapsulant. The scraps of encapsulant at the gate of the package body, that is, the gate scraps, are trimmed or removed together with the dambars. This step is referred to as a "trimming step." Usually, trimming of the gate scrap is just prior to trimming of the dambar.

A typical apparatus for trimming the gate scraps comprises an upper die having multiple trim punches and a lower die having multiple outlets for discharging trimmed scraps. The lead frame including multiple packages is engaged between and secured to the upper and the lower die so that the gate scraps are aligned with the outlets in the lower die. Lowering the trim punches of the upper die trims off the gate scraps and discharges the trimmed gate scrap through the outlets of the lower die. A vacuum suction device removes the trimmed gate scrap from under the outlets.

However, during trimming, the trim punches trim block air flow through the outlets. Accordingly, the vacuum suction device may be unable to remove the trimmed gate scrap from the outlet. Further, the numerous successive trimming steps produce friction and static electricity so that electrostatic forces attract the gate scraps to the dies. Accordingly, the trimmed gate scrap may remain attached to the trim punch or the lower die. The attached gate scrap residues can obstruct the trimming of the next lead frame, clog the trimming apparatus, and/or the crack of the semiconductor device package.

SUMMARY OF THE INVENTION

Accordingly, an object of the present invention is to effectively discharge or remove the trimmed gate scrap by blowing the air into the outlet during the trimming process.

Another object of the present invention is to prevent clogging of the trimming apparatus and/or cracking of semiconductor device packages due to the gate scrap residues.

The foregoing and other objects are achieved by an apparatus having trim punches with air flow routes. In order to trim and remove the gate scrap from an encapsulated package body, the trimming apparatus of the present invention includes a scrap trim die disposed at a lower surface of a lead frame on which the package bodies are formed, and a scrap punch die disposed at an upper surface of the lead frame.

The scrap trim die includes an outlet which corresponds to the gate scrap and serves as a route for discharging the gate scrap after trimming, and first projections which hold the lead frame during trimming of the gate scrap. The scrap punch die includes a trim punch which corresponds to and trims the gate scrap, and second projections which hold the lead frame during trimming of the gate scrap.

The trimming apparatus according to the present invention has an air inflow route on the inside of the trim punch. Since the air successively flows through the air inflow route of the trim punch to the outlet during trimming, the trimmed gate scrap is easily discharged and removed from the outlet. Preferably, the air inflow route may be a through hole formed in and on the trim punch.

The trimming apparatus of the invention preferably includes the scrap trim die having a plurality of the outlets and the scrap punch die having a plurality of the trim punches so that the gate scraps of a plurality of the packages are simultaneously trimmed and removed.

The scrap trim and a transfer rail for transferring the lead frame are on a lower die and the scrap punch die is on an upper die of the trimming apparatus. The lower die further comprises a dambar trim die for trimming dambars of the lead frame and the upper die further comprises a dambar punch die which corresponds to the dambar trim die.

BRIEF DESCRIPTION OF THE DRAWINGS

These and various other features and advantages of the invention will be readily understood with reference to the following detailed description taken in conjunction with the accompanying drawings, wherein like reference numerals designate like structural elements, and, in which.

DETAILED DESCRIPTION

Figure 1:
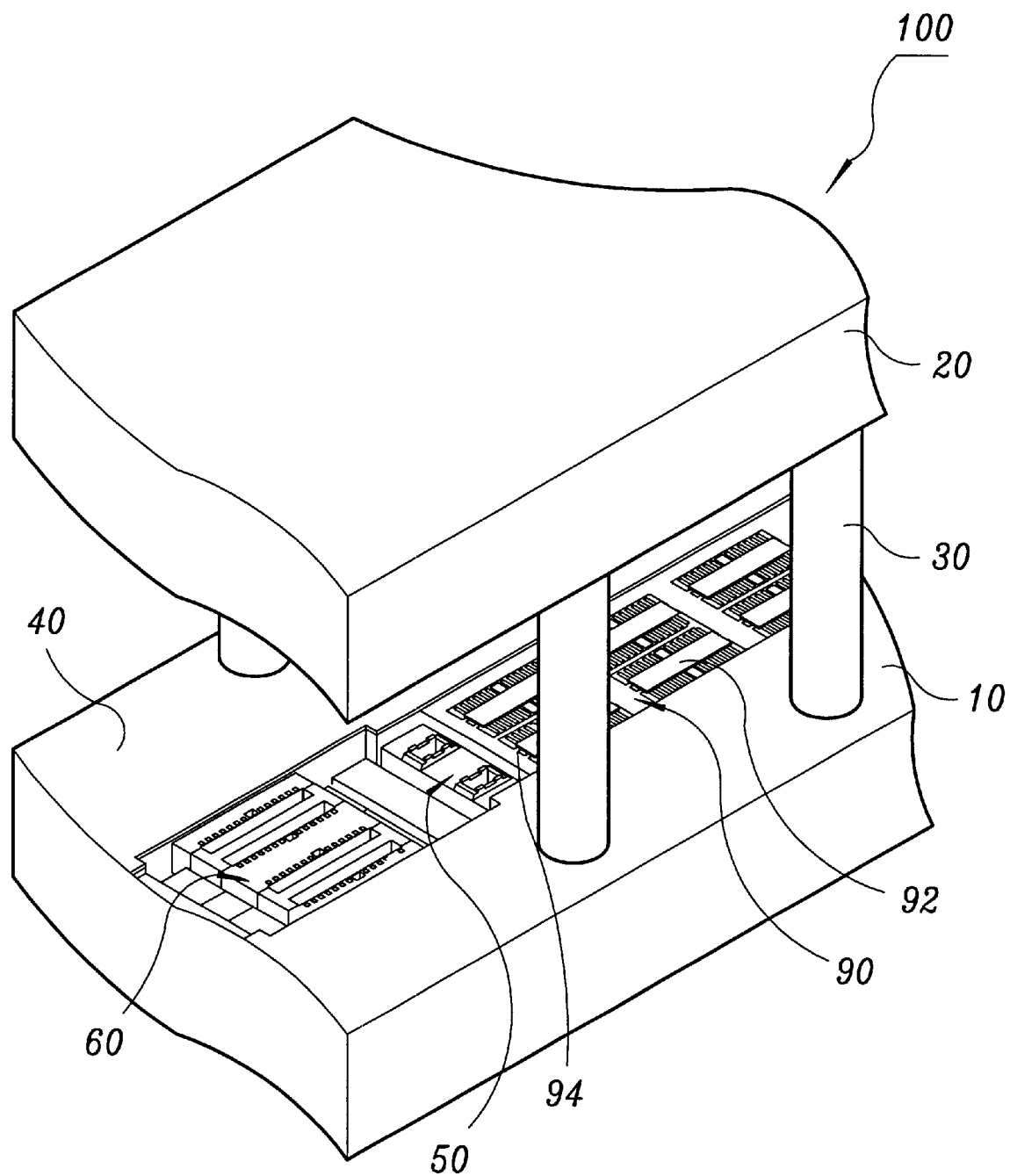
FIG. 1 is a schematic perspective view of an apparatus for trimming gate scrap according to the present invention.
Figure 2:
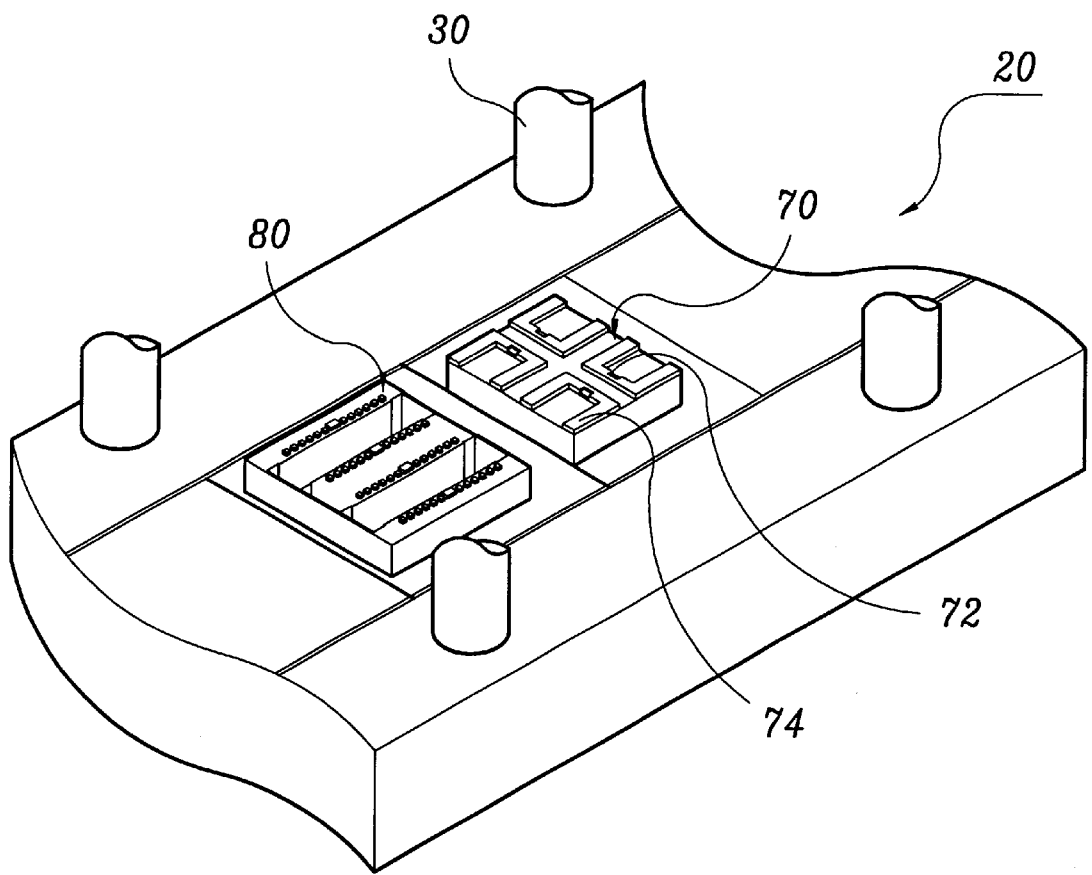
FIG. 2 is a perspective bottom view of an upper die of the trimming apparatus of FIG. 1.

FIG. 1 is a schematic perspective view of an apparatus 100 according to an embodiment of the invention for trimming gate scrap 94, and FIG. 2 is a perspective bottom view of an upper die 20 of apparatus 100 for trimming gate scrap 94 of FIG. 1. Hereinafter, apparatus 100 for trimming gate scrap 94 is referred to as a "trimming apparatus." With reference to FIG. 1 and FIG. 2, a scrap trim die 50 and a dambar trim die 60 are formed on a lower die 10 of trimming apparatus 100, and a scrap punch die 70 and a dambar punch die 80 are formed on an upper die 20 of trimming apparatus 100. Upper die 20 moves up and down along guide bars 30 and reaches lower die 10. A transfer rail 40 for transferring a lead frame 90 is on lower die 10. Embodiments of the present invention will be described below with reference to the accompanying drawings.

The present invention particularly relates to scrap trim die 50 and scrap punch die 70, which are described in more detail below. Lead frame 90 having attached package bodies 92 is fed onto scrap trim die 50 along transfer rail 40 of lower die 10, and then, upper die 20 moves down along guide bars 30 to hold lead frame 90. Then, a trim punch 72 of upper die 20 moves down to trim a gate scrap 94.

Figure 3:
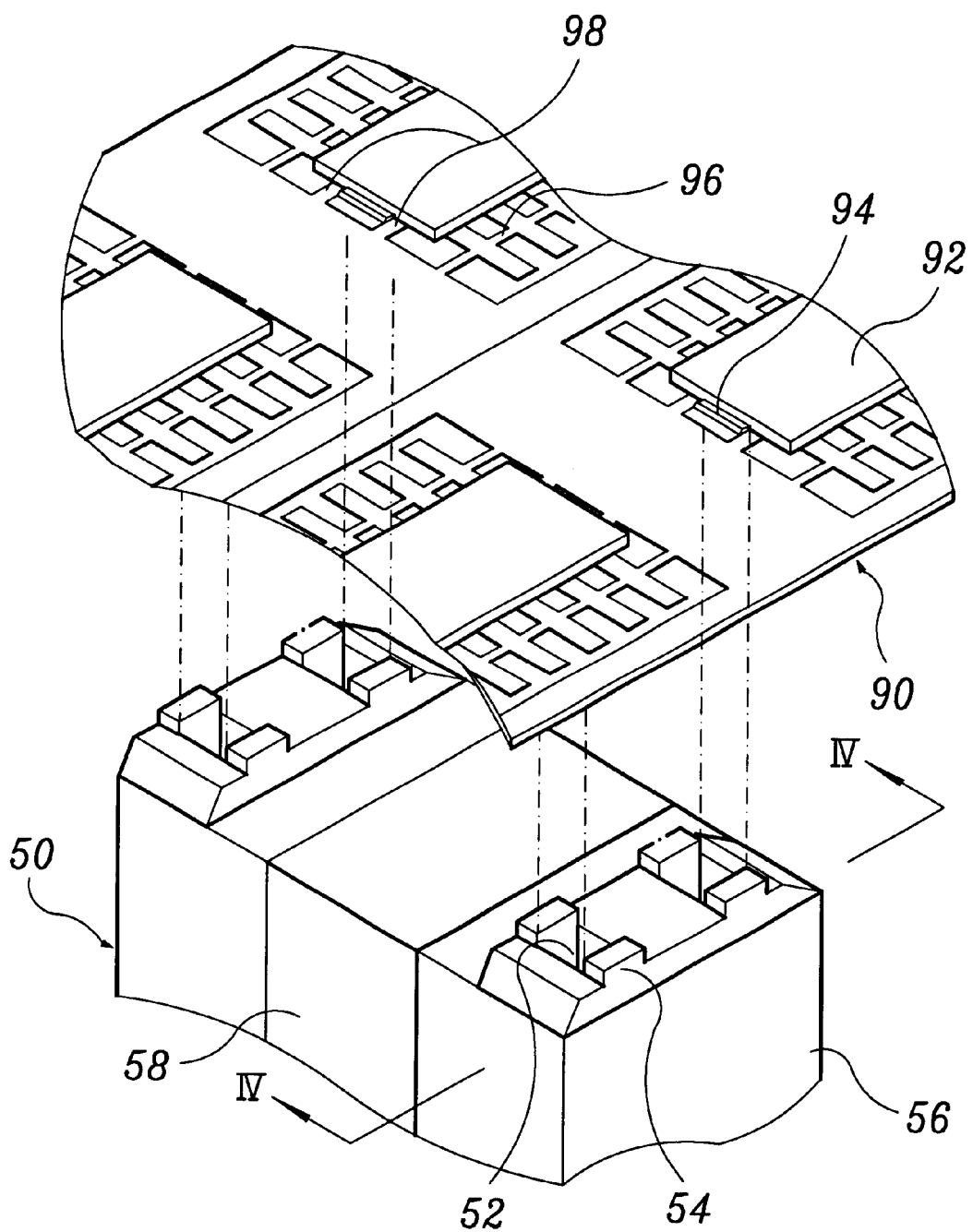
FIG. 3 is an exploded perspective view depicting a connection between a scrap trim die of FIG. 1 and a lead frame.
Figure 4:
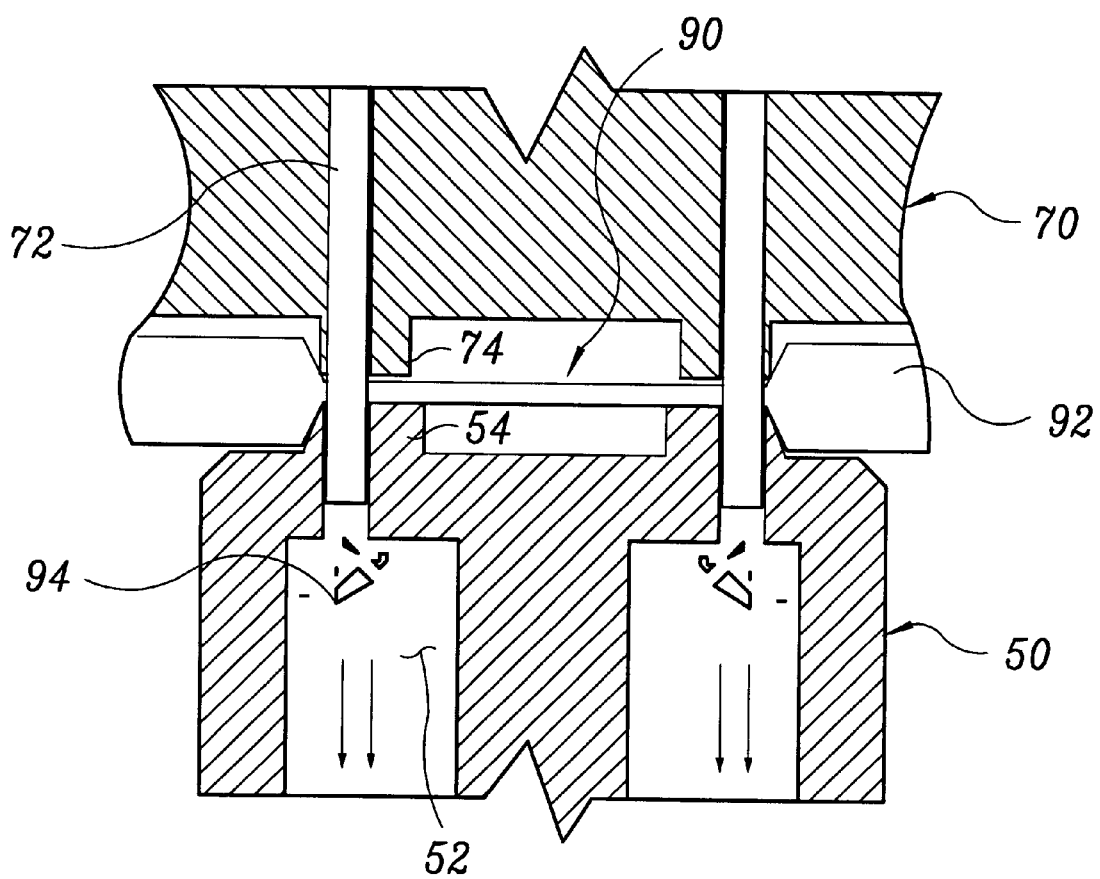
FIG. 4 is a cross-sectional view taken along the line 4—4 in FIG. 3 and shows the gate scrap which is trimmed and discharged.

FIG. 3 and FIG. 4 further illustrate a process for trimming gate scrap 94 and are described below. FIG. 3 is an exploded perspective view depicting a connection between scrap trim die 50 and lead frame 90, and FIG. 4 is a cross-sectional view taken along the line 4—4 in FIG. 3. Lead frame 90 is placed on scrap trim die 50 with gate scraps 94 of package bodies 92 aligned with outlets 52. Gate scraps 94 of package bodies 92 in lead frame 90 are trimmed simultaneously. Thereby, scrap trim die 50 has multiple outlets 52, and scrap punch die 70 has multiple trim punches 72.

Scrap trim die 50 includes a guide block 58 and two outlet blocks 56 which are on opposite sides of guide block 58. Dimensions of outlet blocks 56 depend on the kind of packages. Lead frame 90 shown in FIG. 3 is for a TSOP (Thin Small Outline Package) and has gate scrap 94 between tie bars 98. A reference numeral 96 of FIG. 3 indicates a dambar. Dambars 96 prevent molding compound from overflowing. Just after the trimming of gate scrap 94, dambars 96 are trimmed and removed.

Each outlet 52 of scrap trim die 50 has first projections 54. First projections 54 of scrap trim die 50 face second projections 74 of scrap punch die 70 (FIG. 2 and FIG. 4), and first and second projections 54 and 74 respectively contact the lower and the upper surface of lead frame 90 and hold lead frame 90 during trimming. First and second projections 54 and 74 respectively protrude from scrap trim die 50 and scrap punch die 70 and hold lead frame 90 firmly, so that package body 92 is protected from the impacts during trimming of scrap gate 94.

Trim punches 72 of scrap punch die 70 are aligned with outlets 52 of scrap trim die 50. When scrap trim die 50 and scrap punch die 70 hold lead frame 90, each gate scrap 94 is between an outlet 52 and a trim punch 72. Then, trim punches 72 of scrap punch die 70 move down and trim gate scraps 94. For removing trimmed gate scrap 94, a vacuum suction device (not shown) under outlet 52 sucks in trimmed gate scraps 94 through outlets 52. FIG. 4 shows trimmed gate scrap 94.

In trimming gate scrap 94, conventional trim punches have several problems. In particular, when a trim punch trims a gate scrap, the trim punch blocks air flow through the outlet. Accordingly, the vacuum suction device cannot vacuum away the gate scraps, and the gate scraps remain in the outlets. Further, repeated trimming produces static electricity and electrostatic force that attracts trimmed gate scrap to trim punch and/or scrap trim die. The unremoved gate scraps hinder or delay trimming of next lead frame.

Figure 5A:
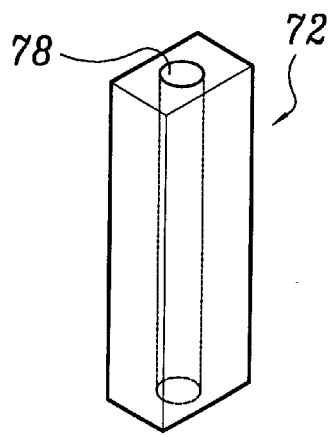
FIG. 5A is a perspective view depicting an embodiment of a trim punch with an air inflow route formed thereon.
Figure 5B:
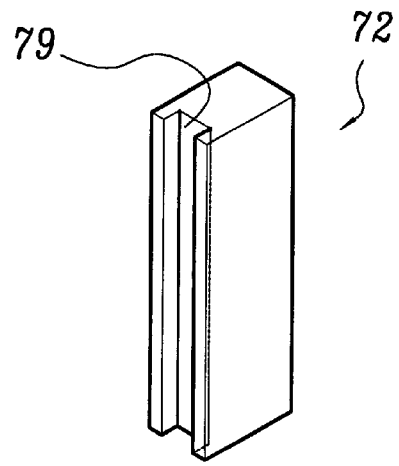
FIG. 5B is a perspective view depicting another embodiment of the trim punch with the air inflow route formed thereon.

In accordance with an aspect of the invention, trimming apparatus 100 includes routes for continuous air flow through outlets 52 during trimming of gate scraps 94. FIG. 5A and FIG. 5B show trim punches 72 according alternative embodiments of the invention. Both embodiments allow continuous air flow from outside to outlet 52 during the trimming. For an air flow route, punch 72 in FIG. 5A has a through hole 78, and punch 72 in FIG. 5B has a groove 79.

Figure 6:
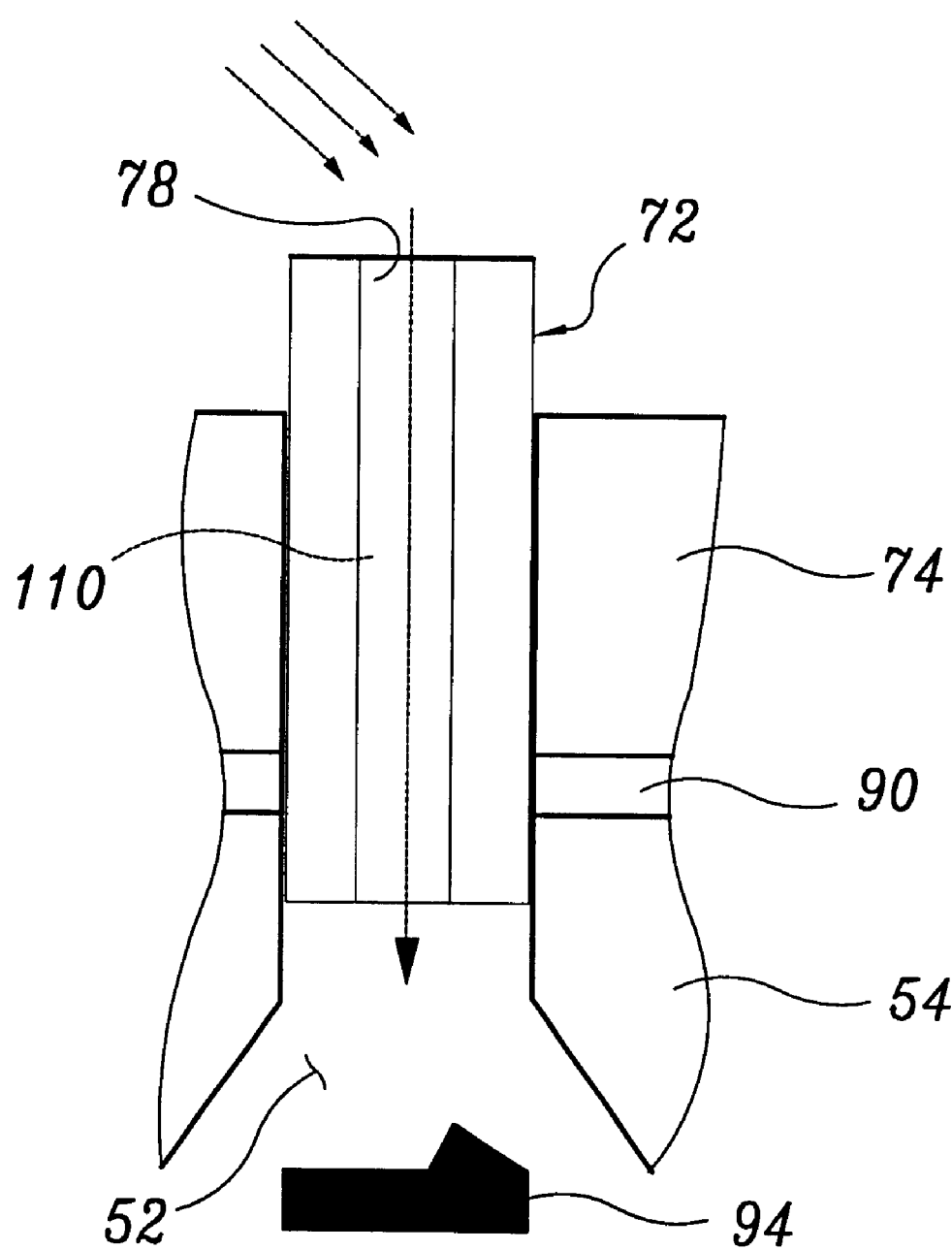
FIG. 6 is a schematic view showing a trimming process of the gate scrap by using the trim punch with the air inflow route formed thereon.

FIG. 6 shows how trim punch 72 in FIG. 5A provides an air flow route. Trim punch 72 trims gate scrap 94 from lead frame 90 which is held between first projections 54 of scrap trim die 50 and second projections 74 of scrap punch die 70. The trim punch 72 is such that outside air can continuously flow through hole 78. A reference numeral 110 in FIG. 6 show an air flow from outside into outlet 52. Accordingly, pressure from the air flow through trim punch 72 and the suction from below outlet 52 prevent trimmed gate scrap 94 from adhering to trim punch 72 and/or scrap trim die 50 and remove trimmed gate scrap from outlet 52. Therefore, the trimmed gate scrap does not remain in outlet 52 or cause clogging of trimming apparatus 100 or cracking of packages.

Although the embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A trimming apparatus comprising a lower die and an upper die, wherein
   the lower die comprises:
      a transfer rail for transferring a lead frame on which package bodies are integrated;
      a scrap trim die that includes a first projection and an outlet, wherein for trimming, the first projection contacts the lead frame and the outlet is under a scrap being trimmed and provides a route for discharging the scrap after trimming; and
      a dambar trim die for trimming dambars; and the upper die comprises:
      a scrap punch die that includes a second projection and a trim punch, wherein the second projection cooperates with the first projection to hold the lead frame for trimming, the trim punch is above the outlet and trims the scrap by moving down through the outlet, and the trim punch provides a route for gas flow through the outlet even while the trim punch moves through the outlet, the route being formed on a portion, which trims the scrap of the trim punch; and
      a dambar punch die.

2. The trimming apparatus of claim 1, wherein the trim punch comprises a groove along a side of the trim punch, the groove providing the route for gas flow through the outlet while the trim punch moves through the outlet.

3. The trimming apparatus of claim 1, wherein the trim punch comprises a hole through the trim punch, the hole providing the route for gas flow through the outlet while the trim punch moves through the outlet.

4. A trimming apparatus comprising:
   a scrap trim die that comprises an outlet, wherein for trimming, the outlet is under a scrap being trimmed and provides a route for discharging the scrap after trimming; and
   a scrap punch die that comprises a trim punch, wherein for trimming, the trim punch is above the outlet and trims the scrap by moving down through the outlet,
      wherein the trim punch includes a groove along a portion, which trims the scrap, of the trim punch, the groove providing a route for gas flow through the outlet while the trim punch moves through the outlet.

5. The trimming apparatus of claim 4, wherein the scrap trim die has multiple outlets and the scrap punch die has multiple trim punches so that the trimming apparatus simultaneously trims a plurality of the scraps.

6. The trimming apparatus of claim 4, further comprising a device that creates a continuous gas flow through the trim punch and the outlet during trimming.

7. The trimming apparatus of claim 4, wherein:

the scrap trim die further comprises a first projection, wherein for trimming, the first projection contacts a lead frame on which package bodies are integrated; and the scrap punch die further comprises a second projection, wherein for trimming, the second projection cooperates with the first projections to hold the lead frame.

8. The trimming apparatus of claim 7, wherein the scrap trim die and a transfer rail for transferring the lead frame are on a lower die and the scrap punch die is on an upper die of the trimming apparatus.

9. A trimming apparatus comprising:

a scrap trim die that comprises an outlet, wherein for trimming, the outlet is under a scrap being trimmed and provides a route for discharging the scrap after trimming; and a scrap punch die that comprises a trim punch, wherein for trimming, the trim punch is above the outlet and trims the scrap by moving down through the outlet, and wherein a hole through the trim punch provides a route for gas flow through the outlet while the trim punch moves through the outlet, the hole being formed through a portion, which trims the scrap of the trim punch.

10. The trimming apparatus of claim 9, wherein:

the scrap trim die further comprises a first projection, wherein for trimming, the first projection contacts a lead frame on which package bodies are integrated; and the scrap punch die further comprises a second projection, wherein for trimming, the second projection cooperates with the first projections to hold the lead frame.

11. The trimming apparatus of claim 10, wherein the scrap trim die and a transfer rail for transferring the lead frame are on a lower die and the scrap punch die is on an upper die of the trimming apparatus.

12. The trimming apparatus of claim 9, wherein the scrap trim die has multiple outlets and the scrap punch die has multiple trim punches so that the trimming apparatus simultaneously trims a plurality of the scraps.

13. The trimming apparatus of claim 9, further comprising a device that creates a continuous gas flow through the trim punch and the outlet during trimming.

* * * * *